(12) United States Patent
Freitag et al.

(10) Patent No.: US 10,867,625 B1
(45) Date of Patent: *Dec. 15, 2020

(54) SPIN TRANSFER TORQUE (STT) DEVICE WITH TEMPLATE LAYER FOR HEUSLER ALLOY MAGNETIC LAYERS

(71) Applicant: Western Digital Technologies, Inc., San Jose, CA (US)

(72) Inventors: James Mac Freitag, Sunnyvale, CA (US); Zheng Gao, San Jose, CA (US); Masahiko Hashimoto, San Jose, CA (US); Sangmun Oh, San Jose, CA (US); Hua Ai Zeng, San Jose, CA (US)

(73) Assignee: WESTERN DIGITAL TECHNOLOGIES, INC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/803,952

(22) Filed: Feb. 27, 2020

Related U.S. Application Data

(60) Provisional application No. 62/825,566, filed on Mar. 28, 2019.

(51) Int. Cl.
*G11B 5/31* (2006.01)
*G11B 5/39* (2006.01)
(Continued)

(52) U.S. Cl.
CPC .......... *G11B 5/315* (2013.01); *G11B 5/1278* (2013.01); *G11B 5/193* (2013.01); *G11B 5/235* (2013.01);
(Continued)

(58) Field of Classification Search
None
See application file for complete search history.

(56) References Cited

U.S. PATENT DOCUMENTS 6,381,106 B1 4/2002 Pinarbasi
7,035,062 B1 4/2006 Mao et al.
(Continued)

FOREIGN PATENT DOCUMENTS

CN 104835510 B 11/2017
JP 2010229477 A 10/2010
(Continued)

OTHER PUBLICATIONS

Braganca, et al.; Nanoscale Magnetic Field Detection Using a Spin Torque Oscillator; Nanotechnology; vol. 21, No. 23; dated 2010.
(Continued)

*Primary Examiner* — William J Klimowicz
(74) *Attorney, Agent, or Firm* — Patterson & Sheridan, LLP; Steven H. Versteeg

(57) ABSTRACT

A spin transfer torque (STT) device has a free ferromagnetic layer that includes a Heusler alloy layer and a template layer beneath and in contact with the Heusler alloy layer. The template layer may be a ferromagnetic alloy comprising one or more of Co, Ni and Fe and the element X, where X is selected from one or more of Ta, B, Hf, Zr, W, Nb and Mo. A CoFe nanolayer may be formed below and in contact with the template layer. The STT device may be a spin-torque oscillator (STO), like a STO incorporated into the write head of a magnetic recording disk drive. The STT device may also be a STT in-plane or perpendicular magnetic tunnel junction (MTJ) cell for magnetic random access memory (MRAM). The template layer reduces the critical current density of the STT device.

23 Claims, 9 Drawing Sheets

(51) Int. Cl.
  *G11B 5/193* (2006.01)
  *G11B 5/127* (2006.01)
  *G11B 5/235* (2006.01)
  *G11B 5/00* (2006.01)

(52) U.S. Cl.
  CPC ............ *G11B 5/314* (2013.01); *G11B 5/3146* (2013.01); *G11B 5/3983* (2013.01); *G11B 2005/0024* (2013.01)

(56) References Cited

U.S. PATENT DOCUMENTS

| | | |
|---|---|---|
| 7,982,996 B2 | 7/2011 | Smith et al. |
| 8,039,885 B2 | 10/2011 | Wang et al. |
| 8,064,159 B2 | 11/2011 | Sakamoto et al. |
| 8,085,490 B2 | 12/2011 | Franca-Neto et al. |
| 8,194,361 B2 | 6/2012 | Kudo et al. |
| 8,259,409 B2 | 9/2012 | Bragana et al. |
| 8,320,080 B1 | 11/2012 | Braganca et al. |
| 8,325,442 B2 | 12/2012 | Koui et al. |
| 8,416,539 B2 | 4/2013 | Carey et al. |
| 8,467,148 B2 | 6/2013 | Iwasaki et al. |
| 8,472,151 B2 | 6/2013 | Wang et al. |
| 8,582,240 B1 | 11/2013 | Chen et al. |
| 8,687,319 B2 | 4/2014 | Igarashi et al. |
| 8,824,104 B1 | 9/2014 | Koui et al. |
| 8,953,283 B2 | 2/2015 | Shimizu et al. |
| 8,970,996 B2 | 3/2015 | Nagasaka et al. |
| 9,042,057 B1 | 5/2015 | Diao et al. |
| 9,064,508 B1 | 6/2015 | Shiimoto et al. |
| 9,099,107 B1 | 8/2015 | Igarashi et al. |
| 9,099,124 B1 | 8/2015 | Freitag et al. |
| 9,208,801 B2 | 12/2015 | Zhang et al. |
| 9,230,571 B1 | 1/2016 | Chen et al. |
| 9,230,597 B2 | 1/2016 | Shimoto et al. |
| 9,236,564 B2 | 1/2016 | Carey et al. |
| 9,275,672 B2 | 3/2016 | Shiroishi et al. |
| 9,305,574 B1 | 4/2016 | Nagasaka et al. |
| 9,337,415 B1 | 5/2016 | Oh et al. |
| 9,368,135 B2 | 6/2016 | Gao |
| 9,881,637 B1 | 1/2018 | Wilson et al. |
| 9,893,273 B2 | 2/2018 | Hu et al. |
| 10,121,497 B1 | 11/2018 | Takahashi et al. |
| 10,186,284 B2 | 1/2019 | Narita et al. |
| 10,236,021 B2 | 3/2019 | Narita et al. |
| 10,276,193 B2 | 4/2019 | Narita et al. |
| 10,325,618 B1 | 6/2019 | Wu et al. |
| 10,366,714 B1 | 7/2019 | Olson et al. |
| 10,460,752 B2 * | 10/2019 | Freitag ............... G11B 5/314 |
| 10,522,744 B2 * | 12/2019 | Jan ..................... H01L 43/08 |
| 10,566,015 B2 * | 2/2020 | Freitag ................ G11C 11/161 |
| 2002/0135935 A1 | 9/2002 | Covington |
| 2008/0112095 A1 | 5/2008 | Carey et al. |
| 2008/0304176 A1 | 12/2008 | Takagishi et al. |
| 2009/0059423 A1 | 3/2009 | Yamada et al. |
| 2009/0257151 A1 | 10/2009 | Zhang et al. |
| 2009/0310244 A1 | 12/2009 | Shimazawa et al. |
| 2010/0157465 A1 | 6/2010 | Sakamoto et al. |
| 2011/0134561 A1 | 6/2011 | Smith et al. |
| 2013/0064971 A1 | 3/2013 | Carey et al. |
| 2013/0250456 A1 | 9/2013 | Yamada et al. |
| 2014/0139952 A1 | 5/2014 | Takeo et al. |
| 2014/0177100 A1 | 6/2014 | Sugiyama et al. |
| 2014/0203383 A1 | 7/2014 | Guo |
| 2015/0010780 A1 * | 1/2015 | Carey .................. G11B 5/3929 428/811.3 |
| 2015/0124347 A1 | 5/2015 | Shimoto et al. |
| 2016/0027455 A1 | 1/2016 | Kudo et al. |
| 2017/0236537 A1 | 8/2017 | Murakami et al. |
| 2018/0268848 A1 | 9/2018 | Narita et al. |
| 2019/0088274 A1 | 3/2019 | Narita et al. |
| 2019/0088275 A1 | 3/2019 | Narita et al. |
| 2019/0259412 A1 * | 8/2019 | Gao ..................... G11B 5/115 |
| 2019/0279667 A1 * | 9/2019 | Freitag ................. G11B 5/35 |
| 2020/0013429 A1 * | 1/2020 | Freitag ................. G11B 5/314 |
| 2020/0105999 A1 * | 4/2020 | Jeong .................. G11C 11/16 |

FOREIGN PATENT DOCUMENTS

| | | |
|---|---|---|
| JP | 201389967 A | 5/2013 |
| JP | 2013251042 A | 12/2013 |
| JP | 2018156709 A | 10/2018 |
| JP | 201957338 A | 4/2019 |
| WO | 2015126326 A1 | 8/2015 |

OTHER PUBLICATIONS

Kittel; :"On the Theory of Ferromagnetic Resonance Absorption"; Physical Review; vol. 73, No. 2; dated Jan. 15, 1948; pp. 155-161.

Fukuzawa, et al. "CPP-GMR films with a current-confined-path nano-oxide layer (CCP-NOL)"; Journal of Physics D: Applied Physcs; vol. 40, No. 5; dated Feb. 16, 2007; abstract only.

Zhu, et al.; "Microwave Assisted Magnetic Recording"; IEEE Transactions on Magnetics; vol. 44, No. 1; dated Jan. 2008; 125-131.

Chen; "Spin Torque Oscillator-Based Integrated Solutions for Magnetic Field Sensing and Wireless Communication Applications"; ResearchGate; https://researchgate.net/publication/272815225, dated Dec. 2014.

Mallary, Mike et al; "Head and Media Challenges for 3 Tb/in2 Microwave-Assisted Magnetic Recording"; IEEE Transactions on Magnetics, vol. 50, No. 7, Jul. 2014 (8 pages).

* cited by examiner

_US 10,867,625 B1_

SPIN TRANSFER TORQUE (STT) DEVICE WITH TEMPLATE LAYER FOR HEUSLER ALLOY MAGNETIC LAYERS

CROSS-REFERENCE TO RELATED APPLICATIONS

This application claims benefit of U.S. provisional patent application Ser. No. 62/825,566, filed Mar. 28, 2019, which is herein incorporated by reference.

BACKGROUND OF THE DISCLOSURE

Field of the Disclosure

Embodiments of the present disclosure relates generally to spin transfer torque (STT) devices, and more particularly to STT devices with Heusler alloy magnetic layers.

Description of the Related Art

Spin transfer torque (STT) is an effect in which the orientation of the magnetization of a magnetic layer in a magnetic tunnel junction (MTJ) or giant magnetoresistance (GMR) spin valve can be modified using a spin-polarized current. Electrons have a property known as spin, which is a small quantity of angular momentum. An electric current is generally unpolarized (i.e., consisting of 50% spin-up and 50% spin-down electrons), while a spin-polarized current is one with more electrons of either spin. Spin-polarized current can be produced by passing a current through a thick magnetic layer (usually called the "fixed" layer or "polarizing" layer). When spin-polarized current above a critical current density is directed into a second, thinner magnetic layer (the "free" layer), angular momentum can be transferred to the free layer, changing the orientation of the free layer's magnetization. This can be used to excite oscillations of the free layer's magnetization, as in a spin-torque oscillator (STO) type of STT device, or flip the orientation of the free layer's magnetization, as in STT memory cells in a non-volatile magnetic random access memory (MRAM) storage device.

The spin-torque oscillator (STO) type of STT device has been proposed for sensing magnetic fields, as described by P. M. Braganca, et al., "Nanoscale magnetic field detection using a spin torque oscillator," _Nanotechnology_, vol. 21, no. 23, p. 235202, 2010, and in U.S. Pat. No. 8,259,409 B2 assigned to the same assignee as this application. The STO has also been proposed for wireless communications applications, as described by T. Chen, "Spin Torque Oscillator-based Integrated Solutions for Magnetic Field Sensing and Wireless Communication Applications", _Electronics, Circuits and Systems (ICECS)_, 2014 21st IEEE International Conference on (pp. WOO5-), IBEE conference proceedings.

A STO type of STT device has also been proposed for perpendicular magnetic recording (PMR) systems, like a PMR disk drive, by incorporation of the STO into the disk drive's conventional write head. In one type of system using a STO, called microwave-assisted magnetic recording (MAMR), a high frequency oscillatory auxiliary magnetic field from the ferromagnetic free layer (also called the field generation layer (FGL) in a STO) is applied to the magnetic grains of the recording layer. The auxiliary field may have a frequency close to the resonance frequency of the magnetic grains in the recording layer to facilitate the switching of the magnetization of the grains at lower write fields from the conventional write head than would otherwise be possible without assisted recording. Conversely, MAMR may be used to increase the coercivity of the magnetic recording layer above that which could be written to by a conventional PMR alone. The increase in coercivity afforded by MAMR allows for a reduction in the size of the magnetic grains and thus a corresponding increase in recording density. MAMR systems are described by J. G. Zhu et al., "Microwave Assisted Magnetic Recording", _IEEE Transactions on Magnetics_, Vol. 44, No. 1, January 2008, pp. 125-131; and in U.S. Pat. No. 7,982,996 B2 and U.S. Pat. No. 8,970,996 B2, both assigned to the same assignee as this application. In a PMR system with a STO incorporated into the disk drive's conventional write head, even if the oscillatory auxiliary magnetic field from the free layer does not provide microwave assistance to writing, the free layer can have a DC field component that will assist writing by the conventional write head.

SUMMARY OF THE DISCLOSURE

In both the STO type of STT device and in a STT-MRAM cell, one or both of the magnetic layers may be formed of Heusler alloys, which are known to have high spin polarization. Heusler alloy layers are difficult to fabricate and require high-temperature annealing to obtain the required crystalline structure. It is also important in STT devices to reduce the critical current, particularly in a disk drive write head where high temperatures can reduce the long-term reliability of the write head. Thus what is needed is a STT device with Heusler alloy magnetic layers that can operate with reduced critical current.

Some embodiments relate to a spin transfer torque (STT) device wherein the ferromagnetic free layer includes a Heusler alloy layer and a template layer located beneath and in contact with the Heusler alloy layer. The template layer may be a ferromagnetic alloy comprising one or more of Co, Ni and Fe and the element X, where X is selected from one or more of Ta, B, Hf, Zr, W, Nb and Mo. In one embodiment, the template layer may be a ferromagnetic CoFeBTa alloy. A CoFe nanolayer may be formed on the substrate below and in contact with the template layer. The template layer reduces the critical current density of the STT device. The ferromagnetic polarizing layer may also comprise a Heusler alloy layer and a template layer. The STT device may be a spin-torque oscillator (STO), like a STO incorporated into the write head of a magnetic recording disk drive. The STT device may also be a STT magnetic random access memory (MRAM) cell, like an in-plane or perpendicular magnetic tunnel junction (MTJ) for use in a MRAM storage device.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

Figure 1:
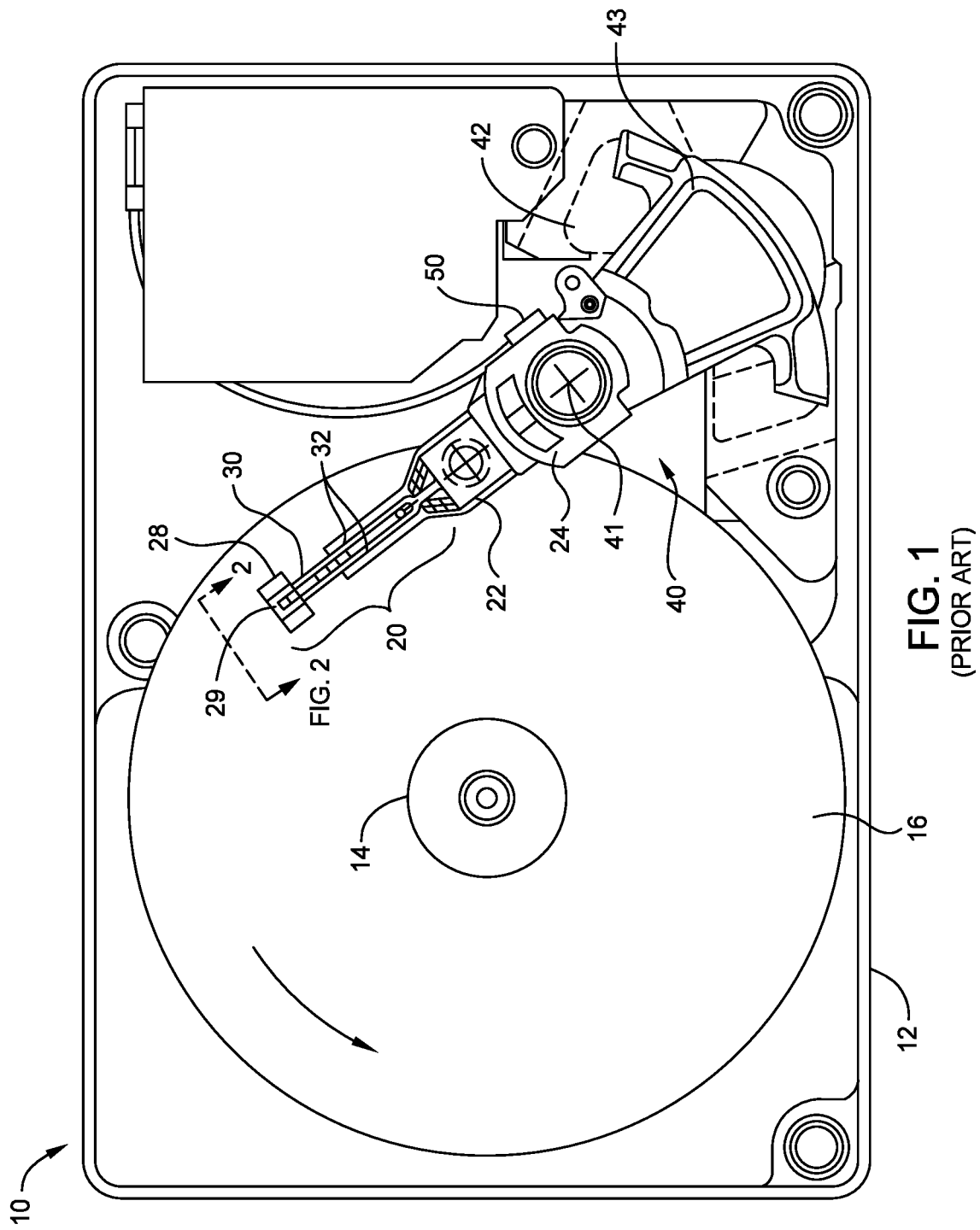
FIG. 1 is a top plan view of a conventional head/disk assembly of a hard disk drive with the cover removed.

FIG. 1 is a top plan view of a conventional head/disk assembly of a hard disk drive 10 with the cover removed. The disk drive 10 includes a rigid base 12 supporting a spindle 14 that supports a stack of disks, including top disk 16. The spindle 14 is rotated by a spindle motor (not shown) for rotating the disks in the direction shown by curved arrow on disk 16. The hard disk drive 10 has at least one load beam assembly 20 having an integrated lead suspension (ILS) or flexure 30 with an array 32 of electrically conductive interconnect traces or lines. The load beam assemblies 20 are attached to rigid arms 22 connected to an E-shaped support structure, sometimes called an E-block 24. Each flexure 30 is attached to an air-bearing slider 28. A magnetic recording read/write head 29 is located at the end or trailing surface 25 of slider 28. In certain embodiments, the write head 29 will incorporate a spin-torque oscillator (STO) type of STT device (not shown). The flexure 30 enables the slider 28 to "pitch" and "roll" on an air-bearing generated by the rotating disk 16. Disk drive 10 also includes a rotary actuator assembly 40 rotationally mounted to the rigid base 12 at a pivot point 41. The actuator assembly 40 is a voice coil motor (VCM) actuator that includes a magnet assembly 42 fixed to base 12 and a voice coil 43. When energized by control circuitry (not shown) the voice coil 43 moves and thereby rotates E-block 24 with attached arms 22 and load beam assemblies 20 to position the read/write heads 29 to the data tracks on the disks. The trace interconnect array 32 connects at one end to the read/write head 29 and at its other end to read/write circuitry contained in an electrical module or chip 50 secured to a side of the E-block 24. The chip 50 includes a read preamplifier and a write driver circuit.

Figure 2A:
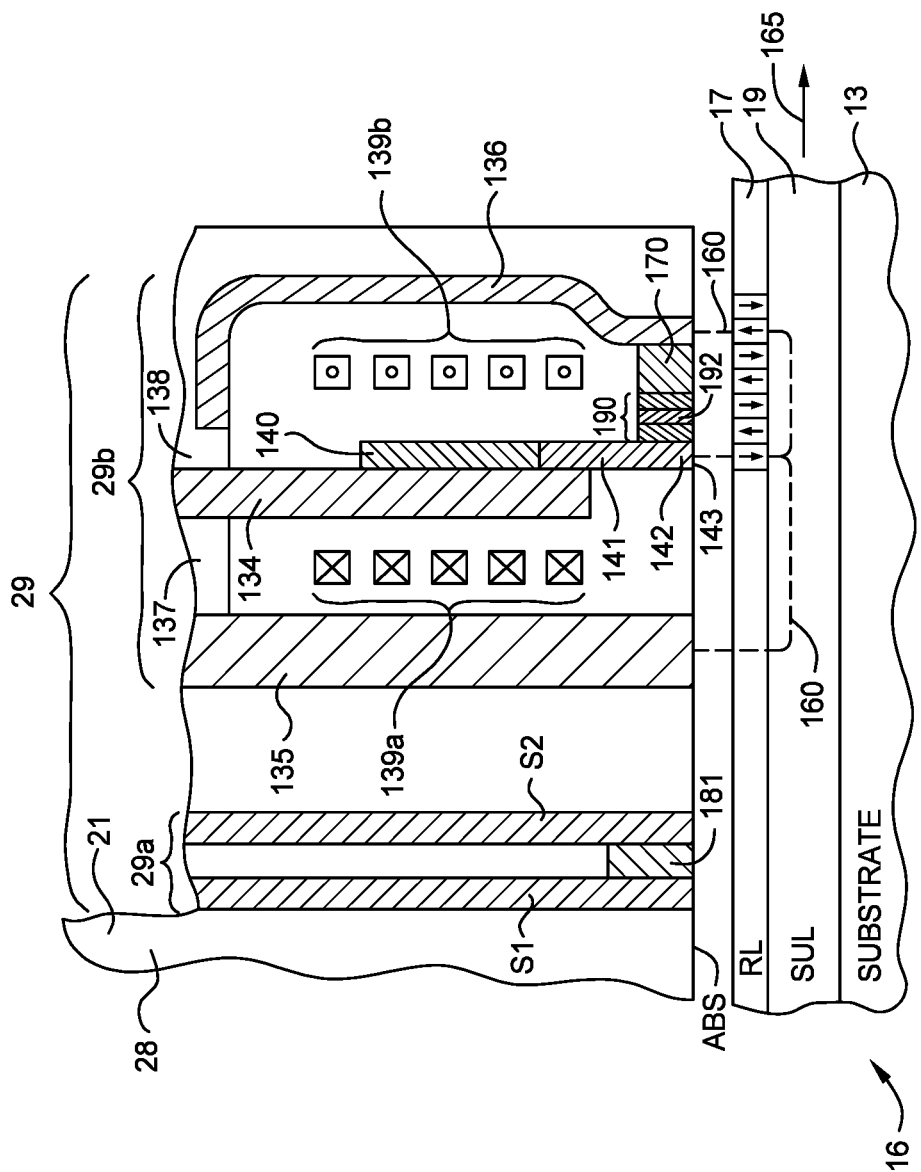
FIG. 2A is a side sectional view of a perpendicular magnetic recording (PMR) write head with an incorporated spin-torque oscillator (STO) as proposed in the prior art, a read head and a recording disk taken through a central plane that intersects the disk.

FIG. 2A is a side sectional view of a perpendicular magnetic recording write head with an incorporated STO as proposed in the prior art, a read head and a recording disk taken through a central plane that intersects a data track on the disk. As shown in FIG. 2A, a "dual-layer" disk 16 includes a perpendicular magnetic data recording layer (RL) 17 on a "soft" or relatively low-coercivity magnetically permeable underlayer (SUL) 19 formed on the disk substrate 13. The read/write head 29 is formed on slider 28 and includes read head 29a and write head 29b. Read head 29a includes a magnetoresistive (MR) read element or sensor 181 located between two magnetic shields SI, S2. The write head 29b is a single write pole type of perpendicular magnetic recording (PMR) write head and includes a yoke structure with main pole 134, write pole 140, first flux return pole 135, second flux return pole 136, trailing magnetic shield 170, STO 190 between write pole 140 and trailing shield 170, and yoke studs 137, 138 connecting the main pole and return poles 135, 136 respectively. The write head 29b also includes a thin film coil 139a, 139b shown in section around main pole 134. The write coil 139a, 139b is a helical coil wrapped around main pole 134, but the write coil may also be a conventional dual "pancake" coil in which all the coil sections are in substantially the same plane and wrapped around the yoke. A flared write pole (WP) 140 is part of the main pole 134 and has a flared portion 141 and a pole tip 142 with an end 143 that faces the outer surface of disk 16. Write current through coil 139a, 139b induces a magnetic field (shown by dashed line 160) from the WP 140 that passes through the RL 17 (to magnetize the region of the RL 17 beneath the WP 140), through the flux return path provided by the SUL 19, and back to the ends 35a, 36a of return poles 35, 36, respectively.

The read/write head 29 is typically formed as a series of thin films deposited on a trailing surface 21 of air-bearing slider 28 that has its air-bearing surface (ABS) supported above the surface of disk 16. The MR read head 29a is comprised of MR sensor 181 located between MR shields S1 and S2 and is deposited on the trailing end 21 of the slider 28 prior to the deposition of the layers making up the write head 29b. In FIG. 2A, the disk 16 moves past the write head 29b in the direction indicated by arrow 165, so the portion of slider 28 that supports the read head 29a and write head 29b is often called the slider "trailing" end, and the surface 21 perpendicular to the slider ABS on which the write head 29b is located is often called the slider "trailing" surface.

The RL 17 is illustrated with perpendicularly recorded or magnetized regions, with adjacent regions having opposite magnetization directions, as represented by the arrows. The magnetic transitions between adjacent oppositely-directed magnetized regions are detectable by the MR sensor 181 as the recorded bits.

FIG. 2A also illustrates a trailing shield (TS) 170 spaced from WP 140. The TS 170 is formed of ferromagnetic material. The STO 190 is located between WP 140 and TS 170. The STO 190 includes a ferromagnetic free layer 192 whose magnetization precesses in the presence of DC current from electrical circuitry (not shown) connected to the WP 140 and the TS 170.

Figure 2B:
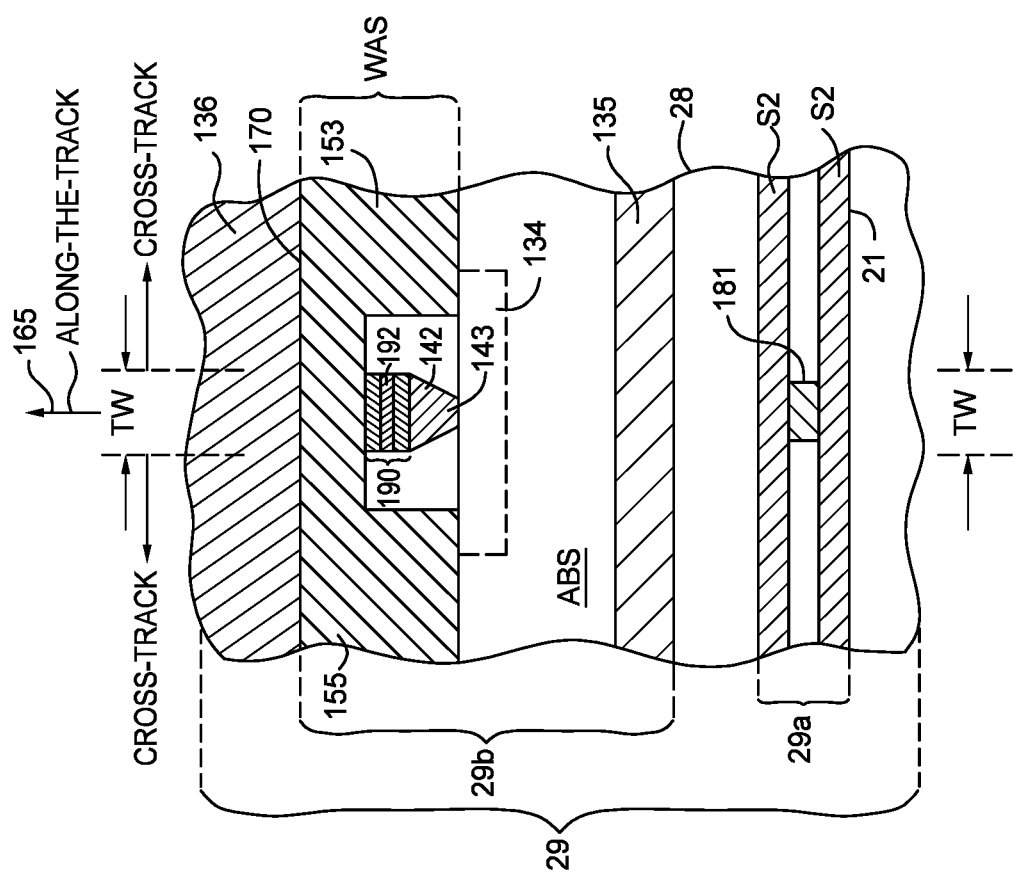
FIG. 2B is a view of the read/write head of FIG. 2A as seen from the disk.

FIG. 2B illustrates the read/write head 29 as seen from the disk 16. The ABS is the recording-layer-facing surface of the slider 28 that faces the disk 16 (FIG. 2A) and is shown without the thin protective overcoat typically present in an actual slider. The recording-layer-facing surface shall mean the surface of the slider 28 that is covered with a thin protective overcoat, the actual outer surface of the slider if there is no overcoat, or the outer surface of the overcoat. The phrase "substantially at the recording-layer-facing surface" shall mean actually at the surface or slightly recessed from the surface. The disk 16 (FIG. 2A) moves relative to the read/write head 29 in the direction 165, which is called the along-the-track direction. The direction perpendicular to direction 165 and parallel to the plane of the ABS is called the cross-track direction. The width of the end 143 of WP tip 142 in the cross-track direction substantially defines the track-width (TW) of the data tracks in the RL 17 (FIG. 2A). The main pole 134 is shown with dashed lines because it is recessed from the ABS (see FIG. 2A).

The portions identified as 153, 155 on opposite ends of TS 170 are side shields which, together with TS 170, form a wraparound shield (WAS) that generally surrounds the WP tip 142. The WAS that includes side shields 153, 155 and TS 170 is described in detail as a shield for a conventional perpendicular recording head in U.S. Pat. No. 7,002,775 B2, assigned to the same assignee as this application. The shields 170, 153, 155 all have ends substantially at the recording-layer-facing surface. The shields 170, 153, 155 are formed as a single-piece structure to form the WAS that substantially surrounds the WP tip 142 and are thus formed of the same material, typically a NiFe, CoFe or NiFeCo alloy, so that they have the same alloy composition. The side shields 153, 155 are separated from WP tip 142 by nonmagnetic gap material. The STO 190 with free layer 192 is located between the WP tip 142 and the TS 170. The WAS alters the angle of the write field and improves the write field gradient at the point of writing, and also shields the writing field at regions of the RL away from the track being written. The WAS is shown as connected to the return pole 136. However, the WAS may be a "floating" WAS shield not connected to either the return pole 136 or other portions of the yoke by flux-conducting material. Also, instead of a WAS, the write head 29b may have separate side shields not connected to the TS 170.

Figure 3:
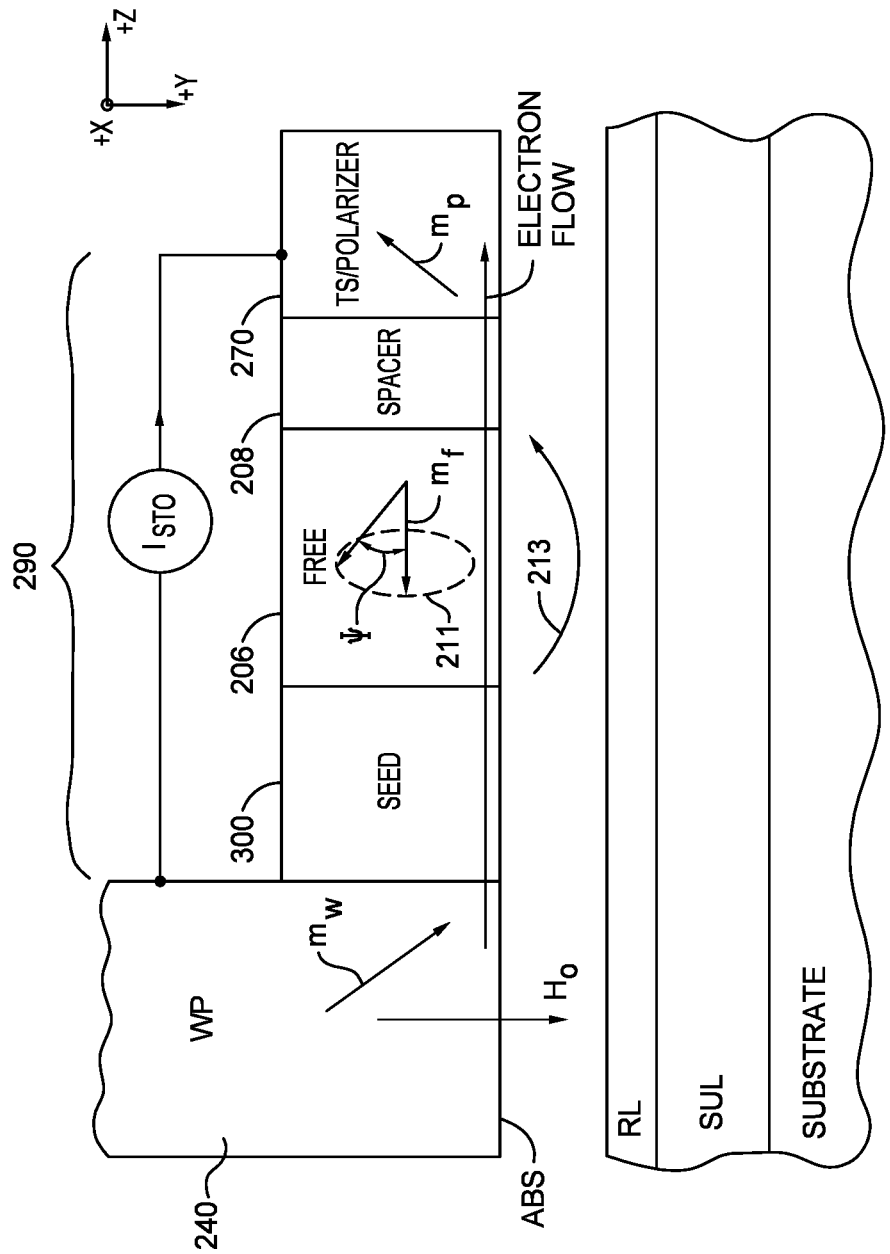
FIG. 3 is a side sectional view of a PMR write head with a STO incorporated into the write head according to one embodiment.

FIG. 3 is a side sectional view of a PMR write head with a spin-torque oscillator (STO) 290 incorporated into the write head according to an embodiment. During writing, the STO electrical circuitry provides DC current $I_{STO}$ between the WP 240 and the TS/polarizer 270. The WP 240 has a magnetization ($m_W$) and thus generates spin-polarized electrons when write current is applied to the write coil. The electron flow, by convention, is in the opposite direction from the WP 240 to the TS/polarizer 270. The TS/polarizer 270, which is formed of ferromagnetic material like CoFe, acts as the polarizer, i.e., the supplier of spin-polarized electrons, for the STO 290 and has a magnetization ($m_p$). The STO's ferromagnetic free layer 206 has an edge substantially at the ABS and has its magnetization ($m_f$) free to rotate. A nonmagnetic spacer layer 208 is located between the free layer 206 and the TS/polarizer 270. The nonmagnetic spacer layer 208 is typically formed of Cu, but may also be formed of other materials like Au or Ag. A nonmagnetic electrically-conducting multilayered seed layer 300 is located between the WP 240 and the free layer 206. The stack of layers making up the STO 290 are formed on the slider body after the write pole 240 is formed, using conventional deposition and lithographic techniques well-known in the fabrication of thin film read/write heads.

In operation of the STO 290, DC current ($I_{STO}$), with a current density J above a critical value $J_c$, is applied across the WP 240 and the TS/polarizer 270. The flow of electrons is from the WP 240 through the seed layer 300 and free layer 206 to TS/polarizer 270, where the electrons are reflected and become spin-polarized. The reflected spin-polarized electrons apply a spin torque on the magnetization $m_f$ of the free layer 206. This induces a precessional motion of the magnetization $m_f$ of the free layer 206. The polarizer magnetization $m_p$ is oriented slightly up and away from the RL in the presence of the write field Ho from the WP 240. The free layer magnetization $m_f$ makes an angle LP with the X-Y plane and has a component in the X-Y plane that rotates at an azimuthal angle about the Z-axis with a certain frequency f. The rotation of the free layer magnetization about the Z-axis at this approximately fixed angle ψ is depicted by the oval 211 which represents a circular precessional motion of the tip of the magnetization vector $m_f$ lying in a plane parallel to the X-Y plane. The frequency of precession depends on the properties and thicknesses of the materials making up the STO 290, but for a specific STO the frequency of precession is a function of the values of both $I_{STO}$ and $H_0$.

During writing, the WP 240 applies a write field $H_0$ to the magnetic grains in the recording layer (RL) at the same time the precession of the free layer magnetization $m_f$ from the STO 290 applies an auxiliary ac field at frequency f to the magnetic grains. This results in microwave-assisted magnetic recording (MAMR), which improves the switching of the magnetization of the grains in the RL, with the improvement depending on the frequency f at which the auxiliary field is applied. As is well known in the art, ferromagnetic materials absorb energy from AC magnetic fields more efficiently at or near their ferromagnetic resonance frequency, as described in Kittel C., "On the Theory of Ferromagnetic Resonance Absorption", *Phys. Rev.* 73, pp. 155-161 (1948). Accordingly, the frequency f of the auxiliary magnetic field from the free layer 206 of the STO 290 is designed to be preferably within a range near the ferromagnetic resonance of the magnetic material making up the grains in the RL, e.g., about 30-50 GHz. As a result, the write field required from the conventional PMR write head can be reduced from what would be required to switch the magnetization of the grains in the RL without MAMR. Conversely, MAMR may be used to increase the coercivity of the RL above that which could be written to by a conventional PMR write head alone. However, even if the frequency f of the auxiliary magnetic field from the free layer 206 is not near the resonance of the magnetic material in the grains of the RL, so that there is no microwave assistance, the magnetization $m_f$ will still provide a DC field component, as shown by arrow 213, that will assist the write field $H_0$. When write current from the coil is switched, the write field is switched from the direction into the RL (as depicted in FIG. 3) to out of the RL, which results in a switching of directions of the magnetizations $m_W$, $m_P$ and $m_f$, as well as the direction of DC field component 213.

Figure 4A:
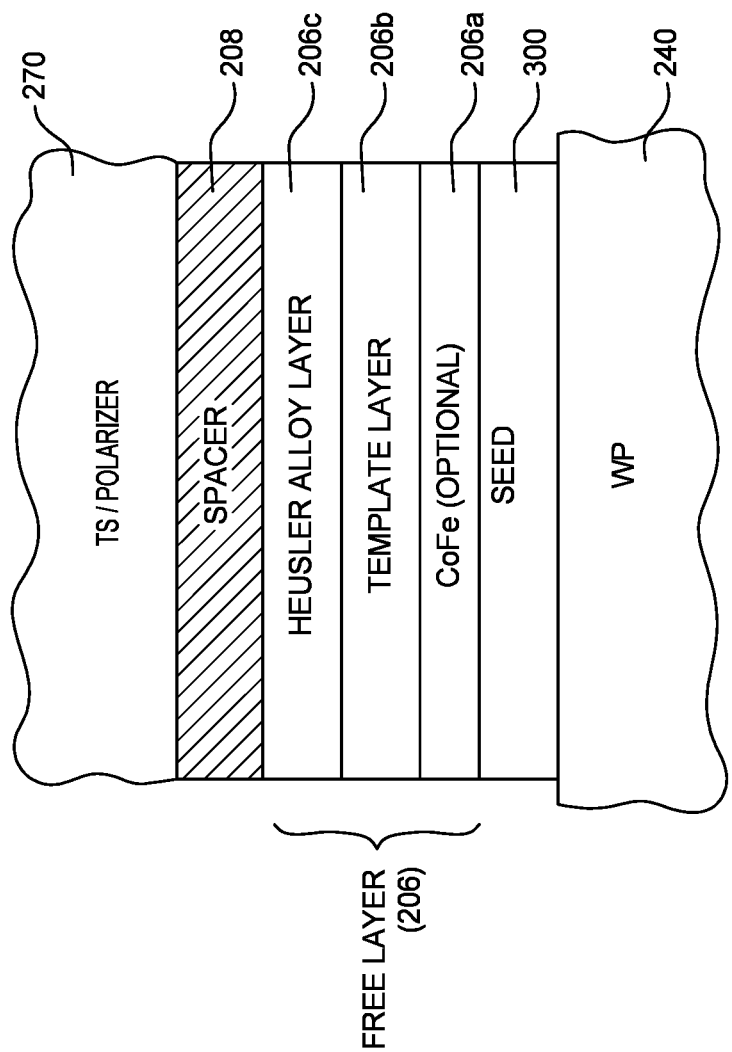
FIG. 4A is a side sectional view of the write head with incorporated STO according to another embodiment.

In one embodiment, as shown in the sectional view of FIG. 4A, the free layer 206 is a multilayer comprising an optional CoFe nanolayer 206a, a ferromagnetic template layer 206b, and a Heusler alloy layer 206c. In certain embodiments, Heusler alloy layer 206c comprises a full Heusler alloy, such as $Co_2MnX$ (where X is one or more of Al, Sb, Si, Sn, Ga, or Ge) or $Co_2FeZ$ (where Z is one or more of Ge, Si, Al, Sn or Ga). In certain embodiments, Heusler alloy layer 206c comprises a half Heusler alloy, such as NiMnSb or PtMnSb. In certain embodiments, the template layer 206b is formed of a ferromagnetic alloy comprising one or more of Co, Ni and Fe and the element X, where X is selected from one or more of Ta, B, Hf, Zr, W, Nb and Mo. In certain embodiments, the template layer 206b is formed of a ferromagnetic alloy comprising two or more of Co, Ni and Fe and the element X, where X is selected from two or more of Ta, B, Hf, Zr, W, Nb and Mo. In one embodiment, the template layer 206b is a ferromagnetic CoFeBTa alloy.

Any one of the layers 206a, 206b and 206c may have a thickness between about 0.1 to 3.0 nm, with the total thickness of multilayer free layer 206 being between about 3 to 9 nm. The seed layer 300 may be a multilayer of nonmagnetic metals or nonmagnetic alloys, like one or more of Cu, Cr, Ta, Ru, Hf, Nb and NiAl. In one embodiment the seed layer is formed of a Cu/Ta/Ru multilayer with a total thickness of about 6 nm.

Figure 4B:
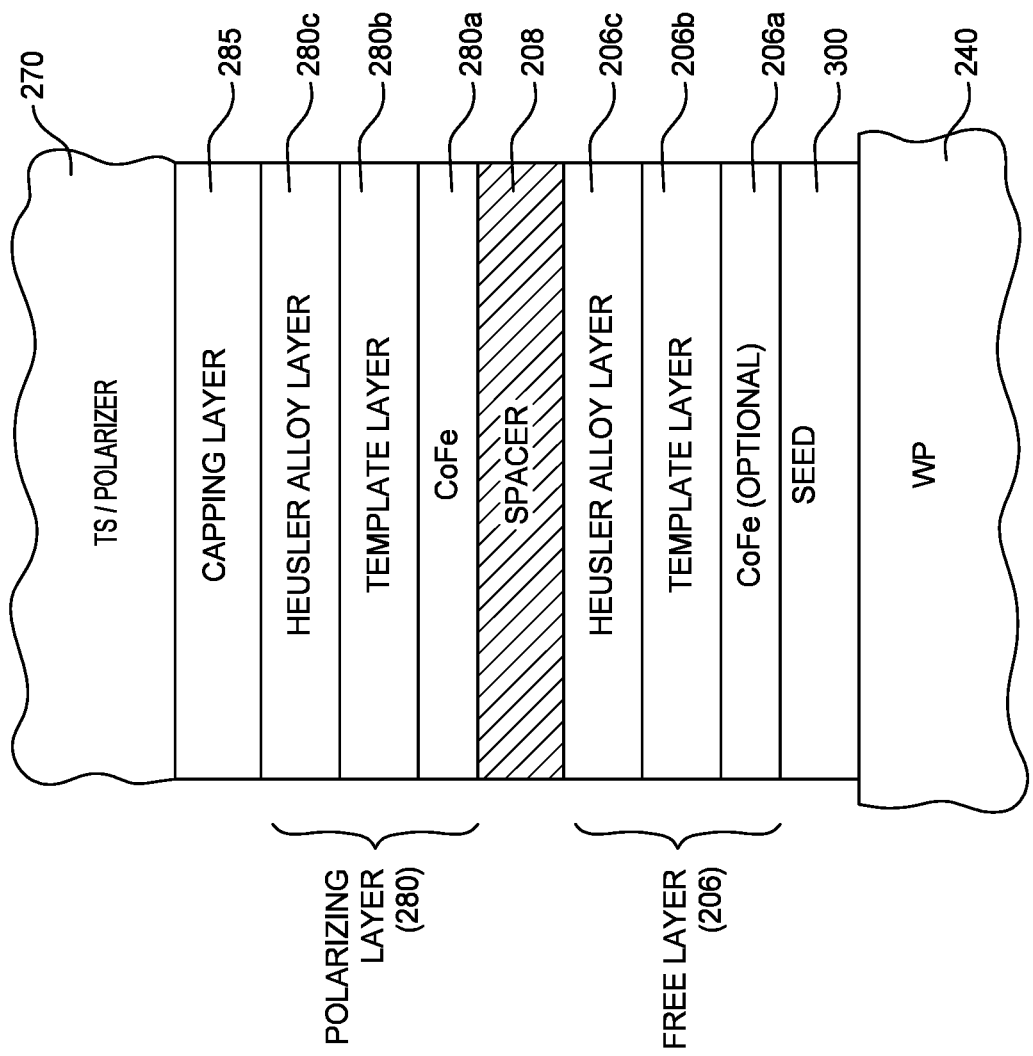
FIG. 4B is a side sectional view of the write head with incorporated STO according to another embodiment.

FIG. 4B is a side sectional view of the write head with incorporated STO according to another embodiment. In this embodiment the seed layer 300 and free layer 206 are like those in FIG. 4A, but there is a separate polarizer layer 280 adjacent the spacer layer 208 and a magnetic or nonmagnetic capping layer 285 between the polarizer layer 280 and the TS/polarizer 270.

The free layer 206 is a multilayer comprising an optional CoFe nanolayer 206a, a ferromagnetic template layer 206b, and a Heusler alloy layer 206c. In certain embodiments, Heusler alloy layer 206c comprises a full Heusler alloy, such as $Co_2MnX$ (where X is one or more of Al, Sb, Si, Sn, Ga, or Ge) or $Co_2FeZ$ (where Z is one or more of Ge, Si, Al, Sn or Ga). In certain embodiments, Heusler alloy layer 206c comprises a half Heusler alloy, such as NiMnSb or PtMnSb. In certain embodiments, the template layer 206b is formed of a ferromagnetic alloy comprising one or more of Co, Ni and Fe and the element X, where X is selected from one or more of Ta, B, Hf, Zr, W, Nb and Mo. In certain embodiments, the template layer 206b is formed of a ferromagnetic alloy comprising two or more of Co, Ni and Fe and the element X, where X is selected from two or more of Ta, B, Hf, Zr, W, Nb and Mo. In one embodiment, the template layer 206b is a ferromagnetic CoFeBTa alloy.

In certain embodiments, the polarizer layer 280 comprises a single layer or a multiple layers of CoFe, NiFe, CoFeNi, CoMnGe, NiCo, NiFeCu, CoFeMnGe, CoMnSi, CoFeSi, other soft or hard ferromagnetic materials, other Heusler alloys, other suitable magnetic layers.

In certain embodiments, the polarizer layer 280 is a multilayer comprising a CoFe nanolayer 280a, an optional template layer 280b, and a Heusler alloy layer 280c. In certain embodiments, Heusler alloy layer 280c comprises a full Heusler alloy, such as $Co_2MnX$ (where X is one or more of Al, Sb, Si, Sn, Ga, or Ge) or $Co_2FeZ$ (where Z is one or more of Ge, Si, Al, Sn or Ga). In certain embodiments, Heusler alloy layer 280c comprises a half Heusler alloy, such as NiMnSb or PtMnSb. A perfect Heusler alloy will have 100% spin-polarization. However it is possible that in a thin-film form and at finite temperatures, the band structure of the Heusler alloy may deviate from its ideal half metal structure and that the spin polarization will decrease. For example, some alloys may exhibit chemical site disorder and crystallize in the B2 structure instead of the L21 Heusler structure. Nevertheless, the spin polarization may exceed that of conventional ferromagnetic alloys. Thus, as used herein a "Heusler alloy" shall mean an alloy with a composition substantially the same as that of a known Heusler alloy, and which results in enhanced spin polarization compared to conventional ferromagnetic materials such as NiFe and CoFe alloys. In certain embodiments, the template layers 280b is formed of a ferromagnetic alloy comprising one or more of Co, Ni and Fe and the element X, where X is selected from one or more of Ta, B, Hf, Zr, W, Nb and Mo.

The capping layer 285 may be formed of a layer or multilayer of metals or metal alloys like Ru, Ir, Ta, T, NiCr, and metal alloys thereof.

A STO similar to that shown in FIG. 4A with a 0.1-1.0 nm CoFe nanolayer on a seed layer, a 0.3-1.2 nm thick magnetic CoFeBTa template layer on the CoFe nanolayer and with a 2-8 nm thick $Co_2MnGe$ Heusler alloy layer on and in contact with the template layer was measured for magnetoresistance (AR/R) and critical current density ($J_C$). The structure showed a 100% increase in AR/R and a 30% reduction in $J_C$ over an identical structure but without the CoFeBTa template layer when formed at a low annealing temperature of about 200° C. The reduction in $J_C$ means a reduction in heating of the STO and the material surrounding it, and thus better reliability for the write head. Also, even if the driving current $I_{STO}$ is not reduced, but maintained, the STO will have better performance. The template layer 206b in the free layer 206 (FIGS. 4A and 4B) is thus important to reduce the critical current density. However, the template layer 280b in the polarizing layer 280 (FIG. 4B) can be considered optional because, while it improves the crystalline structure of the Heusler alloy layer 280c, it has not been shown to substantially reduce the current density.

Figure 4C:
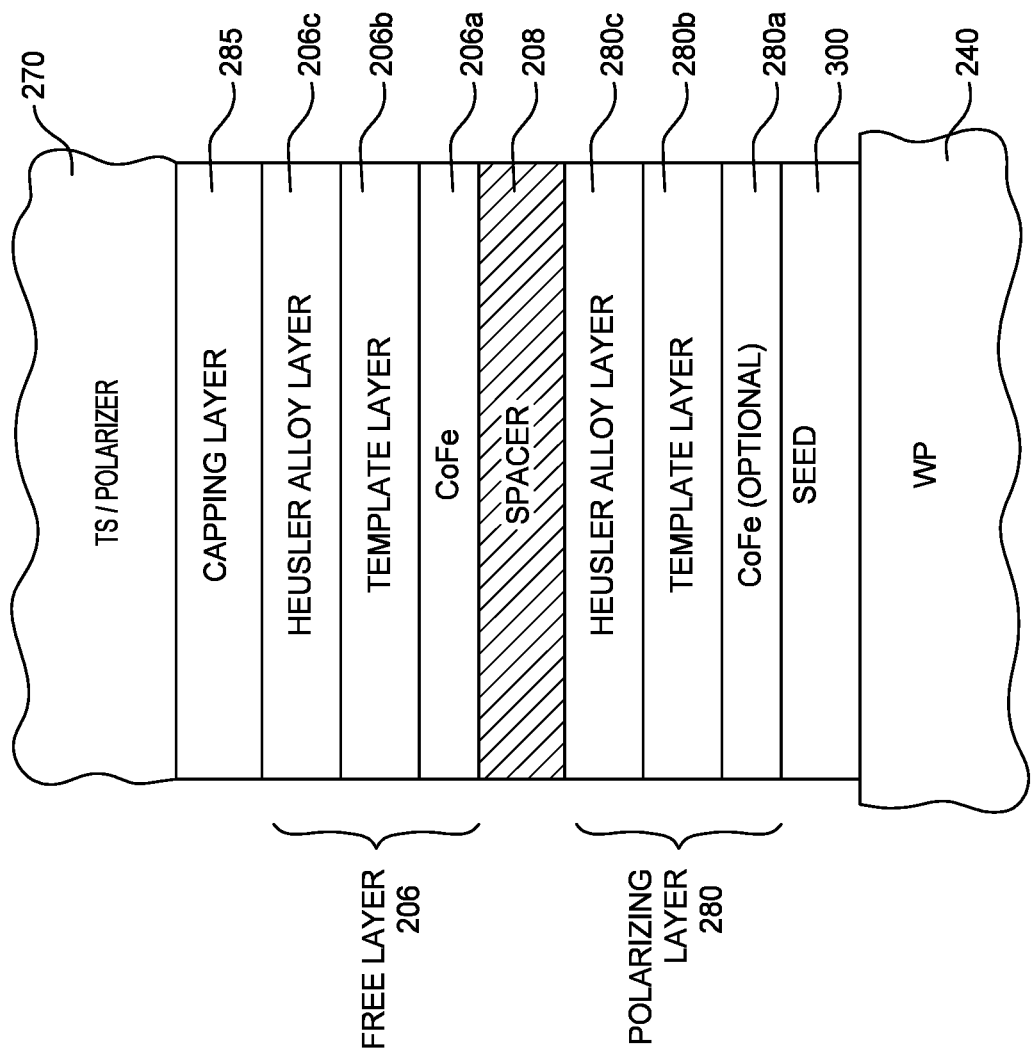
FIG. 4C is a side sectional view of the write head with incorporated STO according to another embodiment.

FIG. 4C is a side sectional view of the write head with incorporated STO according to another embodiment. In this embodiment, a seed layer is on a WP 240, a ferromagnetic polarizer layer 280 is on the seed layer 300. A nonmagnetic spacer layer 208 is on the ferromagnetic polarizing layer 280. A free layer 206 is on the spacer layer 208.

The free layer 206 comprises at least one set of a ferromagnetic Heusler alloy layer 206c on a template layer 206b. The Heusler alloy layer 206c is selected from a group consisting of $Co_2MnX$ (where X is selected from the group consisting of Al, Sb, Si, Sn, Ga, and Ge), $Co_2FeZ$ (where Z is selected from one or more of Ge, Si, Al, Sn or Ga), NiMnSb, and PtMnSb. In certain embodiments, the template layer 206b comprises an alloy comprising one or more of Co, Ni, and Fe and the element X, wherein X is selected from one or more Ta, B, Hf, Zr, W, Nb, and Mo. In certain embodiments, the template layer 206b is formed of a ferromagnetic alloy comprising two or more of Co, Ni and Fe and the element X, where X is selected from two or more of Ta, B, Hf, Zr, W, Nb and Mo. In one embodiment, the template layer 206b is a ferromagnetic CoFeBTa alloy.

In certain embodiments, the polarizer layer 280 comprises a single layer or a multiple layers of CoFe, NiFe, CoFeNi, CoMnGe, NiCo, NiFeCu, CoFeMnGe, CoMnSi, CoFeSi, other soft or hard ferromagnetic materials, other Heusler alloys, other suitable magnetic layers. In certain embodiments, the polarizer layer 280 is a multilayer comprising a CoFe nanolayer 280a, an optional template layer 280b, and a Heusler alloy layer 280c. In certain embodiments, Heusler alloy layer 280c comprises a full Heusler alloy, such as $Co_2MnX$ (where X is one or more of Al, Sb, Si, Sn, Ga, or Ge) or $Co_2FeZ$ (where Z is one or more of Ge, Si, Al, Sn or Ga). In certain embodiments, Heusler alloy layer 280c comprises a half Heusler alloy, such as NiMnSb or PtMnSb.

When electrons flow through the polarizing layer 280 from the WP 240 to the TS 270, the electrons become polarized. The stream of polarized electrons from the polarizing layer 280 to the free layer 206 imparts a spin torque to the free layer 206 causing the free layer 206 to emit a high-frequency magnetic field to the magnetic recording layer or recording medium reducing the coercive force of the recording layer or recording medium and reducing the switch field threshold. In certain embodiments, when electrons flow through the free layer 206 to the TS 270, the electrons are reflected back from the TS/polarizer 270 to the free layer 206 and become spin polarized by the TS/polarizer. The spin-polarized reflected electrons apply a spin torque on the free layer 206. The spin torque from the polarizing layer 280 and from the TS/polarizer 270 to the free layer 206 enhances the oscillation of the free layer 206 and enhances generation of a high-frequency magnetic field from the free layer 206.

The critical current density ($J_C$) of the free layer 206 of FIG. 4c has a reduction in $J_C$ over an identical structure but without a template layer in the free layer when formed at a low annealing temperature of about 200° C. The reduction in $J_C$ means a reduction in heating of the STO and the material surrounding it, and thus better reliability for the write head. Also, even if the driving current $I_{STO}$ is not reduced, but maintained, the STO will have better performance.

Figure 4D:
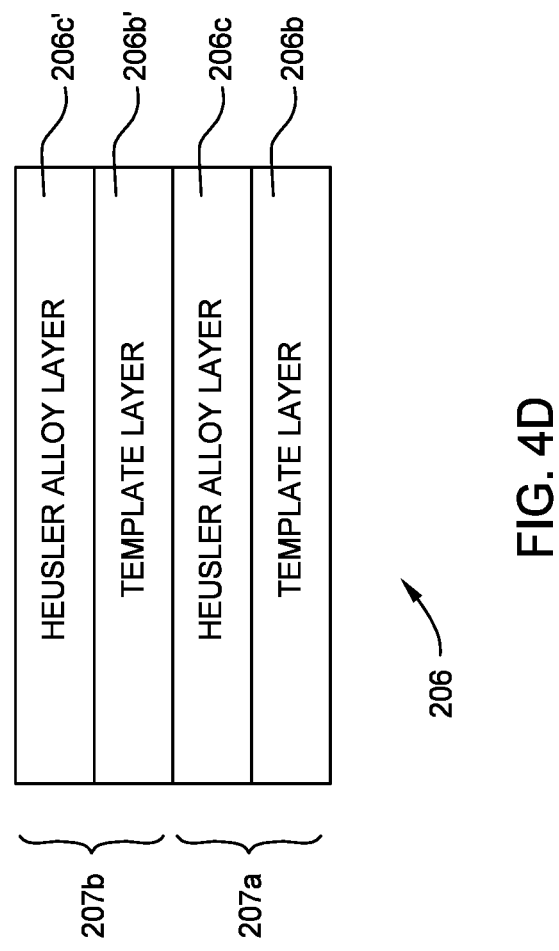
FIG. 4D is a side sectional view of certain embodiments of a multi-set free layer.

FIG. 4D is a side sectional view of certain embodiments of a multi-set free layer 206 comprises two or more sets of a ferromagnetic Heusler alloy layer 206c on a template layer 206b. For example, the multi-set free layer 206 comprises a first set 207a of a ferromagnetic Heusler alloy layer 206c on a template layer 206b and a second set 207b of a ferromagnetic Heusler alloy layer 206c' on a template layer 206b'. The second set 207b is over the first set 207a. The ferromagnetic Heusler alloy layers 206c, 206c' of the first set 207a and the second set 207b may be the same or may be different materials. The template layers 206b, 206b' of the first set 207a and the second set 207b may be the same or may be different materials.

A multi-set free layer 206 comprising a plurality of sets of a ferromagnetic Heusler alloy layer 206c on a template layer 206b may form the STO disclosed herein. In certain embodiments, the STO of FIG. 4a or FIG. 4b comprises a multi-set free layer 206 formed on the seed layer 300. The multi-set free layer 206 may include or not include the optional CoFe layer 206a. In certain embodiments, the STO of FIG. 4c comprises a multi-set free layer 206 formed on the spacer layer 208. The multi-set free layer 206 may include or not include the optional CoFe layer 206a.

Figure 5:
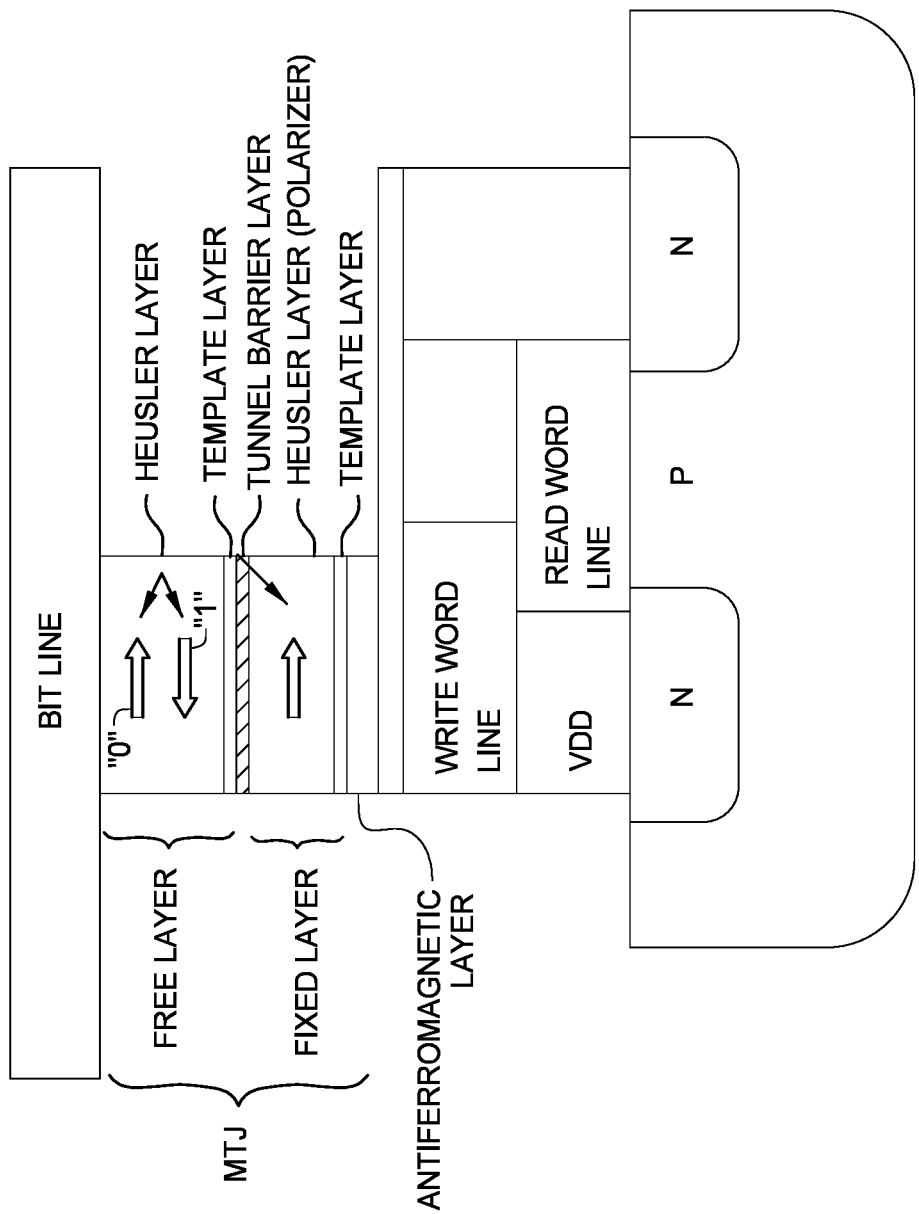
FIG. 5 is a view of a spin transfer torque magnetic random access memory (STT-MRAM) in-plane magnetic tunnel junction (MTJ) cell according to one embodiment.

A STT-MRAM in-plane magnetic tunnel junction (MTJ) cell according to one embodiment is depicted in FIG. 5. In a MRAM structure the STT device is a MTJ cell that includes a ferromagnetic pinned or fixed layer, a dielectric tunnel barrier layer (like a MgO tunnel barrier layer) and a ferromagnetic free layer. The fixed layer acts as the polarizing layer for the source of spin-polarized electrons. The orientation of the magnetization of the fixed layer is fixed in the presence of STT current, while the orientation of the magnetization of the free layer is capable of switching from a parallel configuration with respect to that of the fixed layer (low resistance state by "0") to an antiparallel configuration (high resistance state or "1") by applying STT current through the MTJ cell. Thus, two binary states can be realized for digital data storage in the MRAM. In one embodiment, each of the fixed and free layers comprises a Heusler alloy as described above and is formed on and in contact with a template layer as described above. While FIG. 5 depicts an in-plane MTJ cell, the STT-MRAM may also be one with MTJ cells wherein each of the fixed and free layers has its magnetization oriented perpendicular-to-the-plane. In a perpendicular MTJ cell, the Heusler alloy fixed layer may be coupled to a ferromagnetic multilayer with perpendicular magnetic anisotropy, like a Co/Pt or Co/Pd multilayer, and the Heusler alloy free layer may be coupled to a Co/Ni ferromagnetic multilayer to achieve perpendicular magnetization.

While the foregoing is directed to embodiments of the present disclosure, other and further embodiments of the disclosure may be devised without departing from the basic scope thereof, and the scope thereof is determined by the claims that follow.

What is claimed is:

1. A spin transfer torque (STT) device, comprising:
    a write pole;
    a seed layer on the write pole;
    a ferromagnetic polarizing layer on the seed layer, the ferromagnetic polarizing layer comprising:
        a first template layer over the seed layer; and
        a first ferromagnetic Heusler alloy layer over the first template layer;
    a nonmagnetic spacer layer on the ferromagnetic polarizing layer; and
    a free layer on the spacer layer, the free layer comprising:
        a CoFe layer;
        a second template layer over the CoFe layer; and
        a second ferromagnetic Heusler alloy layer over the second template layer,
    wherein the first ferromagnetic Heusler alloy layer and the second ferromagnetic Heusler alloy layer are independently selected from the group consisting of $Co_2MnX$ (where X is selected from the group consisting of Al, Sb, Si, Sn, Ga, and Ge), $Co_2FeZ$ (where Z is selected from one or more of Ge, Si, Al, Sn, and Ga), NiMnSb, and PtMnSb, and
    wherein the first template layer and the second template layer independently comprise an alloy comprising one or more of Co, Ni, and Fe and the element X, wherein X is selected from one or more Ta, B, Hf, Zr, W, Nb, and Mo.

2. The STT device of claim 1, wherein the ferromagnetic polarizing layer is configured to provide polarized electrons to the free layer.

3. The STT device of claim 1, further comprising:
    a capping layer on the free layer, and
    a trailing shield in contact with the capping layer.

4. The STT device of claim 3, wherein the trailing shield is configured to provide polarized reflected electrons to the free layer.

5. The STT device of claim 1, wherein the second template layer of the free layer lowers the critical current density of the free layer.

6. The device of claim 1, wherein the ferromagnetic polarizing layer further comprises a first CoFe layer between the seed layer and the first template layer.

7. The device of claim 1, wherein the STT device is a magnetic recording device.

8. The device of claim 1, wherein the STT device is a magnetic memory device.

9. A spin transfer torque (STT) device, comprising:
    a write pole;
    a trailing shield;
    a free layer between the write pole and the trailing shield, the free layer comprising a first ferromagnetic Heusler alloy layer on a template layer; and
    a ferromagnetic polarizing layer comprising a second ferromagnetic Heusler alloy layer;

wherein the first ferromagnetic Heusler alloy layer and the second ferromagnetic Heusler alloy layer are independently selected from the group consisting of $Co_2MnX$ (where X is selected from the group consisting of Al, Sb, Si, Sn, Ga, and Ge), $Co_2FeZ$ (where Z is selected from one or more of Ge, Si, Al, Sn, and Gal, NiMnSb, and PtMnSb, and wherein said template layer comprises an alloy comprising two or more of Co, Ni, and Fe and the element X, wherein X is selected from two or more Ta, B, Hf, Zr, W, Nb, and Mo.

10. The STT device of claim 9, wherein ferromagnetic polarizing layer is between the free layer and the trailing shield.

11. The STT device of claim 10, wherein the trailing shield is configured to reflect polarized electrons to the free layer.

12. The STT device of claim 9, wherein ferromagnetic polarizing layer is between the write pole and the free layer.

13. The STT device of claim 12, wherein the trailing shield is configured to reflect polarized electrons to the free layer.

14. The device of claim 9, wherein the STT device is a magnetic recording device.

15. The device of claim 9, wherein the STT device is a magnetic memory device.

16. A spin transfer torque (STT) device, comprising:
a write pole;
a trailing shield;
a multi-set free layer between the write pole and the trailing shield, the multi-set free layer comprising a plurality of sets of a first ferromagnetic Heusler alloy layer on a template layer; and
a ferromagnetic polarizing layer comprising a second ferromagnetic Heusler alloy layer;

wherein the first ferromagnetic Heusler alloy layer in each of the plurality of sets is selected from the group consisting of $Co_2MnX$ (where X is selected from the group consisting of Al, Sb, Si, Sn, Ga, and Ge), $Co_2FeZ$ (where Z is selected from one or more of Ge, Si, Al, Sn or Gal, NiMnSb, and PtMnSb, wherein the second ferromagnetic Heusler alloy layer in each of the plurality of sets is selected from the group consisting of $Co_2MnX$ (where X is selected from the group consisting of Al, Sb, Si, Sn, Ga, and Ge), $Co_2FeZ$ (where Z is selected from one or more of Ge, Si, Al, Sn or Ga), NiMnSb, and PtMnSb, and wherein said template layer in each of the plurality of sets comprises an alloy comprising one or more of Co, Ni, and Fe and the element X, wherein X is selected from one or more Ta, B, Hf, Zr, W, Nb, and Mo.

17. The STT device of claim 16, wherein the template layer of the multi-set free layer lowers the critical current density of the multi-set free layer.

18. The STT device of claim 16, wherein ferromagnetic polarizing layer is between the multi-set free layer and the trailing shield.

19. The STT device of claim 18, wherein the trailing shield is configured to reflect polarized electrons to the multi-set free layer.

20. The STT device of claim 16, wherein ferromagnetic polarizing layer is between the write pole and the multi-set free layer.

21. The STT device of claim 20, wherein the trailing shield is configured to reflect polarized electrons to the multi-set free layer.

22. The device of claim 16, wherein the STT device is a magnetic recording device.

23. The device of claim 16, wherein the STT device is a magnetic memory device.

* * * * *